(12) United States Patent
Lee et al.

(10) Patent No.: US 11,983,339 B2
(45) Date of Patent: May 14, 2024

(54) TOUCH DISPLAY DEVICE

(71) Applicant: LG Display Co., Ltd., Seoul (KR)

(72) Inventors: Neung-Hee Lee, Paju-si (KR);
Sung-Wook Chang, Goyang-si (KR);
Hyung-Soo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/119,521

(22) Filed: Dec. 11, 2020

(65) Prior Publication Data

US 2021/0191556 A1 Jun. 24, 2021

(30) Foreign Application Priority Data

Dec. 18, 2019 (KR) .................. 10-2019-0169943

(51) Int. Cl.
| | |
|---|---|
| *G06F 3/041* | (2006.01) |
| *G06F 3/044* | (2006.01) |
| *H10K 50/84* | (2023.01) |
| *H10K 59/122* | (2023.01) |

(Continued)

(52) U.S. Cl.
CPC ............ *G06F 3/0412* (2013.01); *G06F 3/044* (2013.01); *H10K 50/84* (2023.02); *H10K 59/122* (2023.02); *H10K 59/352* (2023.02); *H10K 59/353* (2023.02); *H10K 59/40* (2023.02)

(58) Field of Classification Search
CPC .... G06F 3/0412; G06F 3/044; G06F 3/04164; G06F 3/0443; G06F 3/0445; G06F 3/041; G06F 3/0448; H01L 27/3216; H01L 27/3218; H01L 27/323; H01L 27/3246; H01L 51/5237; H01L 51/5203;
(Continued)

(56) References Cited

U.S. PATENT DOCUMENTS

| | | | |
|---|---|---|---|
| 10,692,942 B2 | 6/2020 | Kim et al. | |
| 2016/0218159 A1* | 7/2016 | Park | ................... H01L 27/3216 |
| 2018/0039360 A1* | 2/2018 | Akimoto | ............... G06F 3/0446 |

(Continued)

FOREIGN PATENT DOCUMENTS

| | | | | |
|---|---|---|---|---|
| CN | 108281460 A | * | 7/2018 | ........... G06F 3/0412 |
| KR | 10-2018-0015572 A | | 2/2018 | |

(Continued)

OTHER PUBLICATIONS

Office Action issued in corresponding Korean Patent Application Action No. 10-2019-0169943 dated May 21, 2021.

(Continued)

*Primary Examiner* — Stephen G Sherman

(74) *Attorney, Agent, or Firm* — Morgan, Lewis & Bockius LLP

(57) ABSTRACT

The present disclosure provides a touch display device for minimizing viewing-angle-dependent variation in color coordinates. The touch display device includes a light-emitting element disposed in each of a plurality of subpixels including emission areas having different sizes, a plurality of touch electrodes disposed on the light-emitting element, and at least one opening formed in each of the plurality of touch electrodes. The width of the opening is formed differently in each of the plurality of subpixels including the emission areas having different sizes, thereby minimizing viewing-angle-dependent variation in color coordinates.

22 Claims, 13 Drawing Sheets

(51) Int. Cl.
*H10K 59/35* (2023.01)
*H10K 59/40* (2023.01)

(58) Field of Classification Search
CPC .... H10K 59/353; H10K 59/40; H10K 59/122; H10K 59/352; H10K 50/84; H10K 50/805
See application file for complete search history.

(56) References Cited

U.S. PATENT DOCUMENTS

| | | | |
|---|---|---|---|
| 2018/0164931 | A1 | 6/2018 | Na et al. |
| 2018/0197924 | A1* | 7/2018 | Tada .................... G06F 3/0443 |
| 2018/0286925 | A1 | 10/2018 | Kim et al. |
| 2018/0350884 | A1 | 12/2018 | Won et al. |
| 2018/0373104 | A1* | 12/2018 | Qin .................. G02F 1/134336 |
| 2019/0294284 | A1 | 9/2019 | Akimoto et al. |

FOREIGN PATENT DOCUMENTS

| | | | |
|---|---|---|---|
| KR | 10-2018-0067772 A | 6/2018 | |
| KR | 10-2018-0112165 A | 10/2018 | |
| KR | 10-2018-0131011 A | 12/2018 | |

OTHER PUBLICATIONS

Office Action dated May 18, 2022, issued in corresponding Korean Patent Application No. 10-2022-0036734.
Korean Notice of Allowance dated Sep. 17, 2023, issued in corresponding Korean Patent Application No. 10-2022-0036734.

* cited by examiner

TOUCH DISPLAY DEVICE

This application claims the benefit of Korean Patent Application No. 10-2019-0169943, filed on Dec. 18, 2019, which is hereby incorporated by reference as if fully set forth herein.

BACKGROUND

Technical Field

The present disclosure relates to a touch display device, and more particularly to a touch display device for minimizing viewing-angle-dependent variation in color coordinates.

Discussion of the Related Art

A touch sensor is an input device through which a user may input a command by selecting instructions displayed on a screen of a display device using a hand or an object. That is, the touch sensor converts a contact position that directly contacts a human hand or an object into an electrical signal and receives selected instructions based on the contact position as an input signal. Such a touch sensor may substitute for a separate input device that is connected to a display device and operated, such as a keyboard or a mouse, and thus the range of application of the touch sensor is continually increasing.

Recently, research and development have been actively conducted on a touch display device in which touch electrodes 50, which constitute a touch sensor, are disposed on a display panel including a display element such as a light-emitting element 10 or a liquid crystal element, as shown in FIG. 1.

However, when a user uses a touch display device from a side viewing angle direction, rather than from a front viewing angle direction, a portion of the light generated in the light-emitting element 10 may not be radiated to the outside due to the presence of the touch electrodes 50. Accordingly, when a user uses the touch display device from a front viewing angle direction, a white color is realized normally, but when a user uses the touch display device from a side viewing angle direction, color coordinates vary, and thus a white color is not realized normally. In particular, although the sizes of emission areas of subpixels are different, the areas in which light is blocked by the touch electrodes are the same at the side viewing angle, and thus variation in color coordinates is large at the side viewing angle.

SUMMARY

Accordingly, embodiments of the present invention are directed to a touch display device that substantially obviates one or more problems due to limitations and disadvantages of the related art.

An aspect of the present disclosure is to provide a touch display device for minimizing viewing-angle-dependent variation in color coordinates.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a touch display device comprises a light-emitting element disposed in each of a plurality of subpixels including emission areas having different sizes, a plurality of touch electrodes disposed on the light-emitting element, and at least one opening formed in each of the plurality of touch electrodes. The width of the opening is formed differently in each of the plurality of subpixels including the emission areas having different sizes.

It is to be understood that both the foregoing general description and the following detailed description of the present invention are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Reference will now be made in detail to exemplary embodiments of the present disclosure, examples of which are illustrated in the accompanying drawings.

Figure 1:
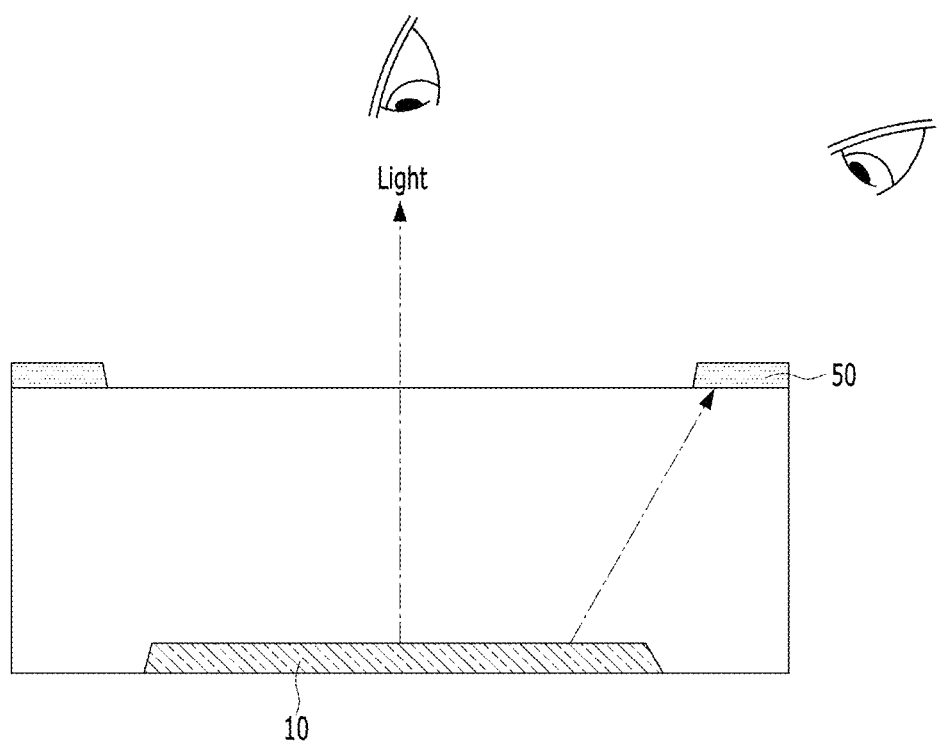
FIG. 1 is a cross-sectional view showing a conventional touch display device.
Figure 2:
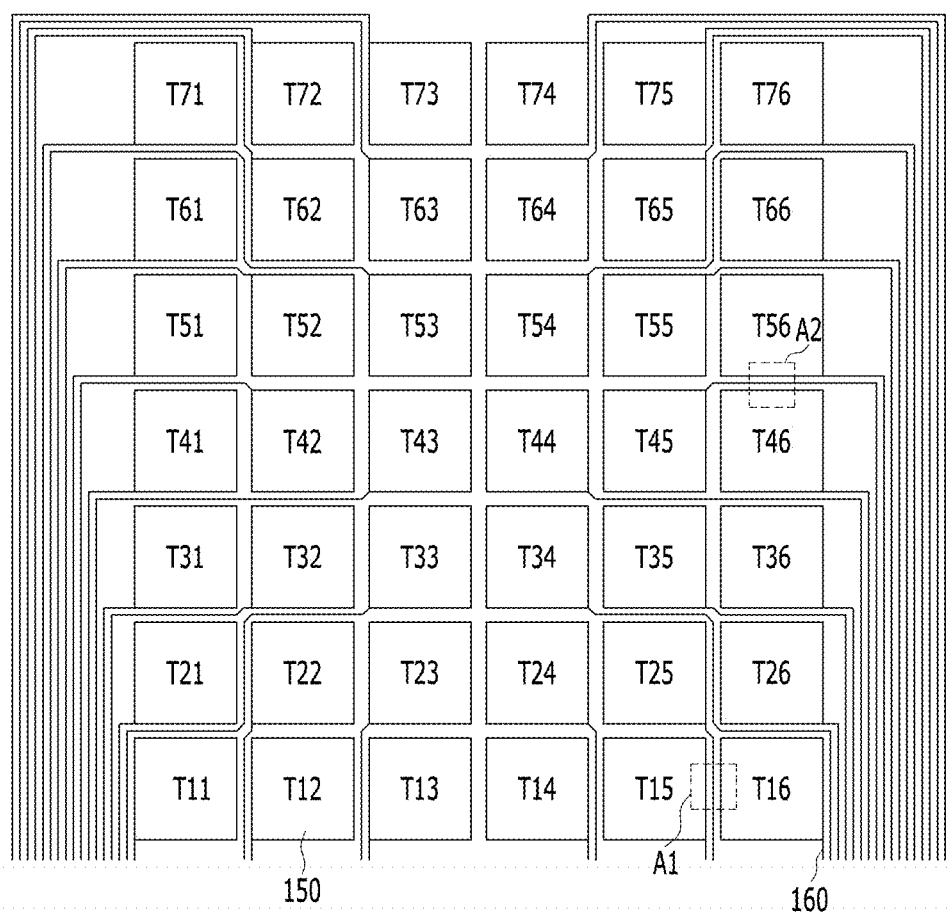
FIG. 2 is a plan view showing a touch display device according to the present invention.

FIG. 2 is a plan view showing a touch display device according to the present invention.

The touch display device shown in FIG. 2 includes a plurality of touch electrodes 150 (T11 to T76) and touch lines 160 connected to the respective touch electrodes 150.

Each of the touch electrodes 150 includes a capacitance formed therein, and thus is used as a self-capacitance-type touch sensor that senses variation in capacitance due to a user touch. In a self-capacitance sensing method using such touch electrodes 150, when a driving signal supplied through the touch line 160 is applied to the touch electrode 150, an electric charge Q accumulates in the touch sensor. At this time, when a user's finger or a conductive object touches the touch electrode 150, parasitic capacitance is additionally connected to the self-capacitance sensor, and thus the capacitance value varies. Therefore, it is possible to determine the presence or absence of a touch based on the difference in capacitance values between a touch sensor that is touched by a finger and a touch sensor that is not touched by a finger.

Figure 3:
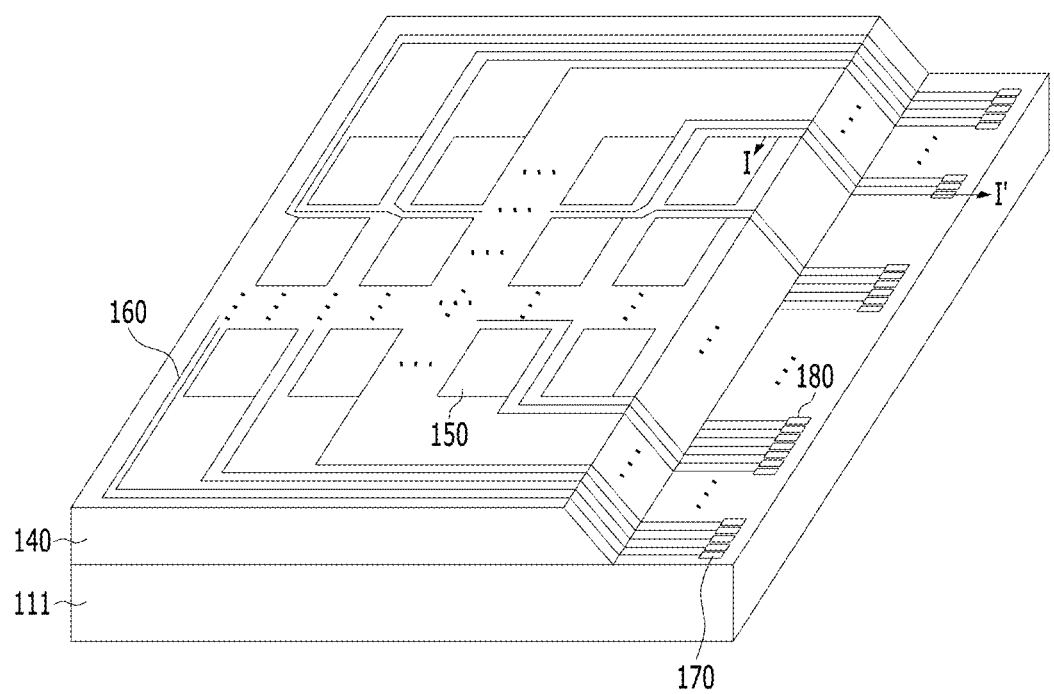
FIG. 3 is a perspective view showing the touch display device shown in FIG. 2.

The touch electrodes 150, as shown in FIG. 3, are divided from each other in first and second directions intersecting each other, and are independently formed on an encapsulation unit 140. Each of the touch electrodes 150 is formed in a region corresponding to a plurality of subpixels in consideration of the size of an area touched by a user. For example, one touch electrode 150 is formed in a region that is from several times to several hundred times larger than the size of one subpixel.

The touch electrodes 150 are formed so as to be the same size as each other. Accordingly, variation in touch sensitivity between the touch electrodes 150 is minimized, thus reducing noise.

The touch electrodes 150 are connected to the touch lines 160, and thus are connected to a touch-driving circuit (not shown).

Figure 4:
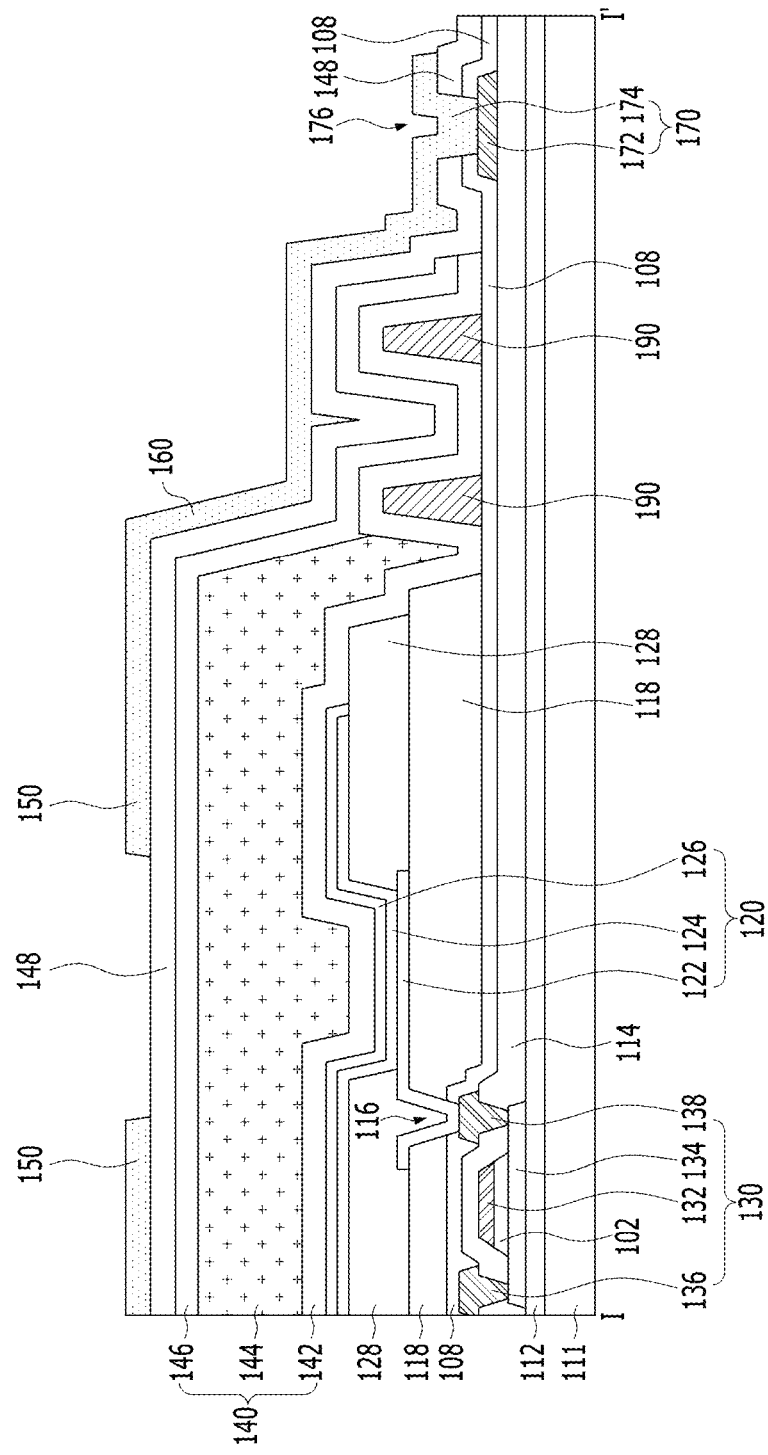
FIG. 4 is a cross-sectional view of the touch display device taken along line I-I' in FIG. 3.

The touch electrodes 150 and the touch lines 160 of the present invention are directly formed on a display panel that generates an image. Specifically, as shown in FIGS. 3 and 4, the touch display device according to the present invention includes light-emitting elements 120 arranged in a matrix form on a substrate 111, an encapsulation unit 140 disposed on the light-emitting elements 120, and touch electrodes 150 disposed on the encapsulation unit 140.

The substrate 111 is formed of a flexible material such as plastic or glass so as to be foldable or bendable. For example, the substrate 111 is formed of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

A plurality of thin-film transistors 130, included in the pixel-driving circuit, is disposed on the substrate 111. Each of the thin-film transistors 130 includes a semiconductor layer 134 disposed on a multi-buffer film 112, a gate electrode 132 overlapping the semiconductor layer 134 with a gate insulating film 102 interposed therebetween, and source and drain electrodes 136 and 138 formed on an interlayer insulating film 114 so as to be in contact with the semiconductor layer 134. Here, the semiconductor layer 134 is formed of at least one of an amorphous semiconductor material, a polycrystalline semiconductor material, or an oxide semiconductor material.

The light-emitting element 120 includes an anode 122, at least one light-emitting stack 124 formed on the anode 122, and a cathode 126 formed on the light-emitting stack 124.

The anode 122 is electrically connected to the drain electrode 138 of the thin-film transistor 130, which is exposed through a pixel contact hole 116 penetrating a protective film 108 and a pixel planarization layer 118.

At least one light-emitting stack 124 is formed on the anode 122 in an emission area that is defined by a bank 128. The at least one light-emitting stack 124 is formed by stacking a hole-related layer, an organic emission layer, and an electron-related layer on the anode 122 in that order or in the reverse order. In addition, the light-emitting stack 124 may include first and second light-emitting stacks, which face each other with a charge generation layer interposed therebetween. In this case, the organic emission layer of any one of the first and second light-emitting stacks generates blue light, and the organic emission layer of the other one of the first and second light-emitting stacks generates yellow-green light, whereby white light is generated through the first and second light-emitting stacks. Since the white light generated in the light-emitting stack 124 is incident on a color filter located above or below the light-emitting stack 124, a color image may be realized. Alternatively, colored light corresponding to each subpixel may be generated in each light-emitting stack 124 without a separate color filter in order to realize a color image. That is, the light-emitting stack 124 of the red subpixel may generate red light, the light-emitting stack 124 of the green subpixel may generate green light, and the light-emitting stack 124 of the blue subpixel may generate blue light.

The cathode 126 is formed so as to face the anode 122, with the light-emitting stack 124 interposed therebetween, and is connected to a low-voltage supply line.

The encapsulation unit 140 prevents external moisture or oxygen from permeating the light-emitting element 120, which is vulnerable to external moisture or oxygen. To this end, the encapsulation unit 140 includes at least one inorganic encapsulation layer 142 and at least one organic encapsulation layer 144. In the present invention, the structure of the encapsulation unit 140, in which the first inorganic encapsulation layer 142, the organic encapsulation layer 144 and the second inorganic encapsulation layer 146 are stacked in that order, will be described by way of example.

The first inorganic encapsulation layer 142 is formed on the substrate 111, on which the cathode 126 has been formed. The second inorganic encapsulation layer 146 is formed on the substrate 111, on which the organic encapsulation layer 144 has been formed, so as to cover the top surface, the bottom surface and the side surface of the organic encapsulation layer 144 together with the first inorganic encapsulation layer 142.

The first and second inorganic encapsulation layers 142 and 146 minimize or prevent the permeation of external moisture or oxygen into the light-emitting stack 124. The first and second inorganic encapsulation layers 142 and 146 are formed of an inorganic insulating material that is capable of being deposited at a low temperature, such as silicon nitride (SiNx), silicon oxide (SiOx), silicon oxynitride (SiON), or aluminum oxide (Al2O3). Thus, since the first and second inorganic encapsulation layers 142 and 146 are deposited in a low-temperature atmosphere, it is possible to prevent damage to the light-emitting stack 124, which is vulnerable to a high-temperature atmosphere, during the process of depositing the first and second inorganic encapsulation layers 142 and 146.

The organic encapsulation layer 144 serves to dampen the stress between the respective layers due to bending of the organic light-emitting display device and to increase planarization performance. The organic encapsulation layer 144 is formed on the substrate 111, on which the first inorganic encapsulation layer 142 has been formed, using a non-photosensitive organic insulating material, such as PCL, acrylic resin, epoxy resin, polyimide, polyethylene or silicon oxycarbide (SiOC), or using a photosensitive organic insulating material such as photoacryl. The organic encapsulation layer 144 is disposed in the active area, rather than in the non-active area.

The mesh-type touch electrodes 150 and the touch lines 160 are disposed on the encapsulation unit 140. In order to prevent an increase in the capacitance of the parasitic capacitor between the touch electrodes 150 and the cathode 126, a touch buffer film 148, which is implemented as an inorganic or organic insulating film, may be disposed between the encapsulation unit 140 and the touch electrodes 150. In this case, the touch lines 160 are disposed along the side surface of the touch buffer film 148. In a touch display device not including the touch buffer film 148, the touch lines 160 are disposed along the side surface of the second inorganic encapsulation layer 146.

The touch electrodes 150 and the touch lines 160 are disposed in the same plane and are formed of the same material. That is, the touch electrodes 150 and the touch lines 160 are disposed in a single-layered structure without an insulating film. Accordingly, the touch electrodes 150 and the touch lines 160 may be formed through a single mask process. Further, it is possible to reduce the thickness of the touch display device that includes the touch electrodes 150 and the touch lines 160.

The touch electrodes 150 and the touch lines 160 are formed in a single-layered or multi-layered structure using a touch metal layer formed of a material having high corrosion resistance and acid resistance and excellent conductivity, such as Ta, Ti, Cu, or Mo. For example, the touch electrodes 150 and the touch lines 160 are formed in a triple-layered structure such as a stack of Ti/Al/Ti, MoTi/Cu/MoTi, or Ti/Al/Mo.

Black matrixes (not shown) may be disposed on the touch electrodes 150 and the touch lines 160, and color filters (not shown) may be disposed between the black matrixes.

The black matrixes prevent the touch electrodes 150 and the touch lines 160 from being visible due to reflection of external light. The color filters prevent the cathode 126 from being visible due to reflection of external light. Further, the black matrixes and the color filters may be disposed between the touch electrodes 150 and the encapsulation unit 140 in order to prevent an increase in the capacitance of the parasitic capacitor between the touch electrodes 150 and the cathode 126.

A touch pad 170 connected to the touch lines 160 is connected to a signal transmission film on which the touch-driving circuit (not shown) is mounted.

The touch pad 170 includes a lower touch pad electrode 172 and an upper touch pad electrode 174 that is in contact with the lower touch pad electrode 172. The lower touch pad electrode 172 is disposed in the same plane as at least one of the gate electrode 132 or the drain electrode 138, and is formed of the same material. For example, the lower touch pad electrode 172 is formed of the same material as the drain electrode 138, and is disposed in the same plane as the drain electrode 138, i.e. on the interlayer insulating film 114. The upper touch pad electrode 174 is disposed in the same plane as the touch electrode 150, and is formed of the same material. The upper touch pad electrode 174 is electrically connected to the lower touch pad electrode 172, which is exposed through a touch pad contact hole 176 that penetrates the protective film 108 and the touch buffer film 148.

Figure 5:
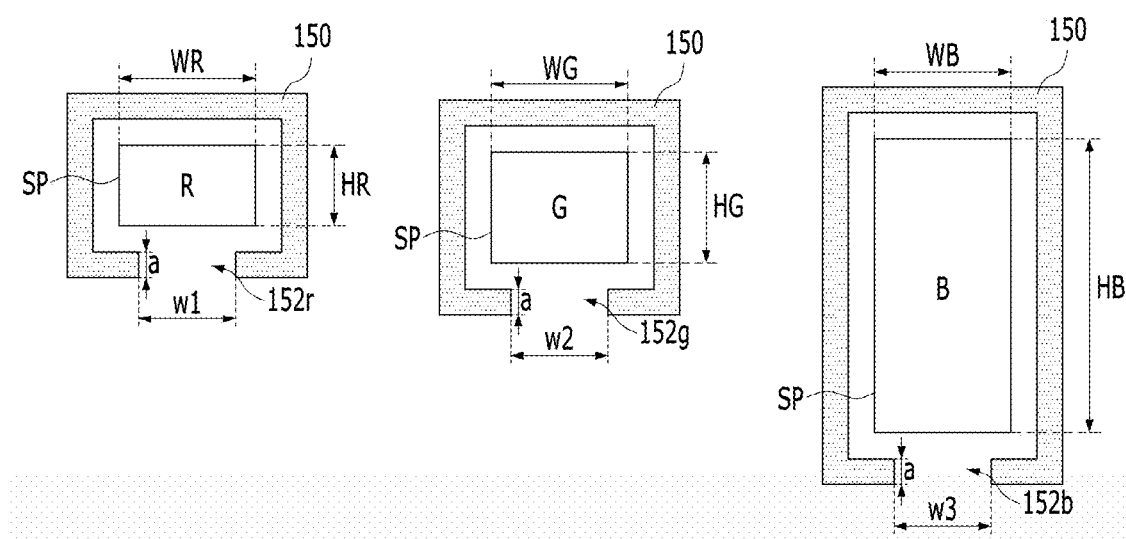
FIG. 5 is a view showing the relationships between the touch electrodes and the subpixels shown in FIGS. 2 and 3.

As shown in FIG. 5, the touch electrode 150 of the touch display device according to the present invention is formed to have therein at least one opening 152r, 152g and 152b. For example, the touch electrode 150 disposed so as to surround the red (R) subpixel SP has therein a red opening 152r having a first width w1, the touch electrode 150 disposed so as to surround the green (G) subpixel SP has therein a green opening 152g having a second width w2, and the touch electrode 150 disposed so as to surround the blue (B) subpixel SP has therein a blue opening 152b having a third width w3.

In this case, the line widths of the red, green and blue openings 152r, 152g and 152b are determined depending on the size of the emission area of the light-emitting layer 124 that is exposed by the bank 128. The line widths of the red, green and blue openings 152r, 152g and 152b are inversely proportional to the size of the emission area of each subpixel SP. Here, the size of the emission area is determined by multiplying the width WR, WG or WB of the light-emitting layer 124 exposed by the bank 128 in each subpixel SP by the height HR, HG or HB of the light-emitting layer 124 exposed by the bank 128.

Specifically, the line widths w1, w2 and w3 of the red, green and blue openings 152r, 152g and 152b are determined such that the proportions of the emission areas in the respective subpixels depending on whether light is interrupted by the touch electrode 150 are constant, as expressed using the following Equation 1. In Equation 1, "a" represents the width of the touch electrode 150.

$$\text{Area Proportion Depending on Light Interruption} =$$
$$\frac{(WR \times HR) - (a \times W1)}{(WR \times HR)} =$$
$$\frac{(WG \times HG) - (a \times W2)}{(WG \times HG)} = \frac{(WB \times HB) - (a \times W3)}{(WB \times HB)}$$

Equation 1

For example, among the plurality of subpixels SP included in the unit pixel, the line width of the opening in the subpixel SP having the largest emission area is formed to be the narrowest, and the line width of the opening in the subpixel SP having the smallest emission area is formed to be the widest. For example, when the size of the emission area of the red (R) subpixel SP is smaller than the size of the emission area of the green (G) subpixel SP, the line width w1 of the red opening 152r is formed larger than the line width w2 of the green opening 152g according to the size ratio between the emission areas of the red (R) and green (G) subpixels SP. When the size of the emission area of the green (G) subpixel SP is smaller than the size of the emission area of the blue (B) subpixel SP, the line width w2 of the green opening 152g is formed larger than the line width w3 of the blue opening 152b according to the size ratio between the emission areas of the green (G) and blue (B) subpixels SP.

Specifically, the touch display device composed of the unit pixel, which includes the green (G) subpixel SP, which has a larger emission area than the red (R) subpixel SP and a smaller emission area than the blue (B) subpixel SP, includes a touch electrode 150, which is formed in any one of the structures shown in FIGS. 6A to 6D.

Figure 6A:
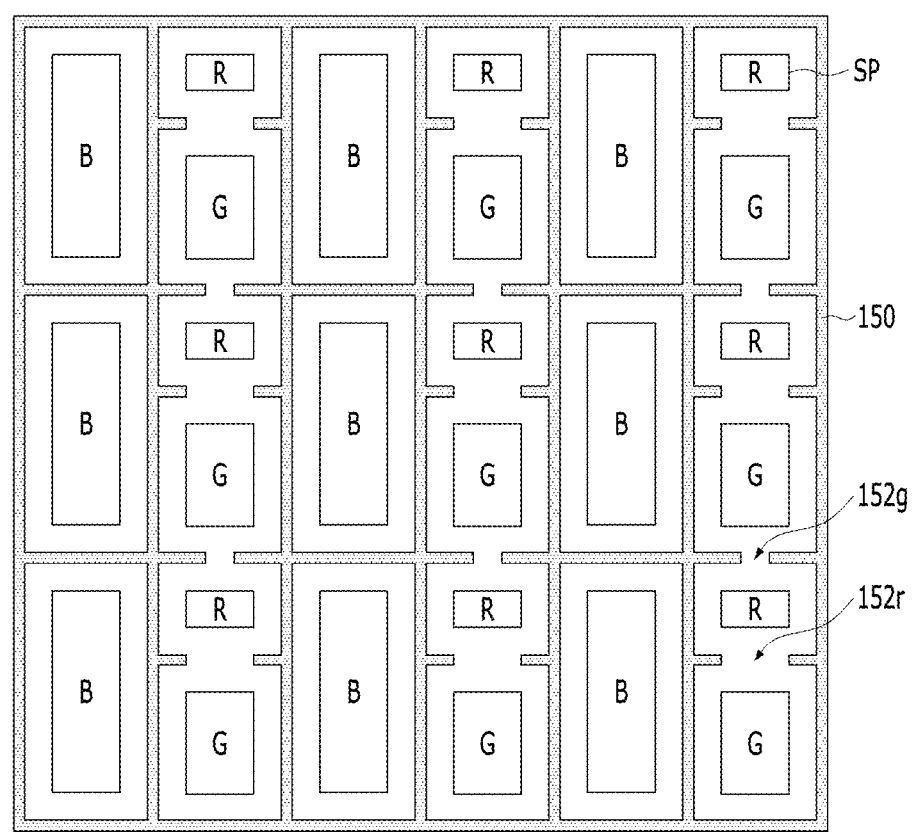
FIGS. 6A to 6D are plan views showing embodiments of the touch electrodes shown in FIG. 5.
Figure 6B:
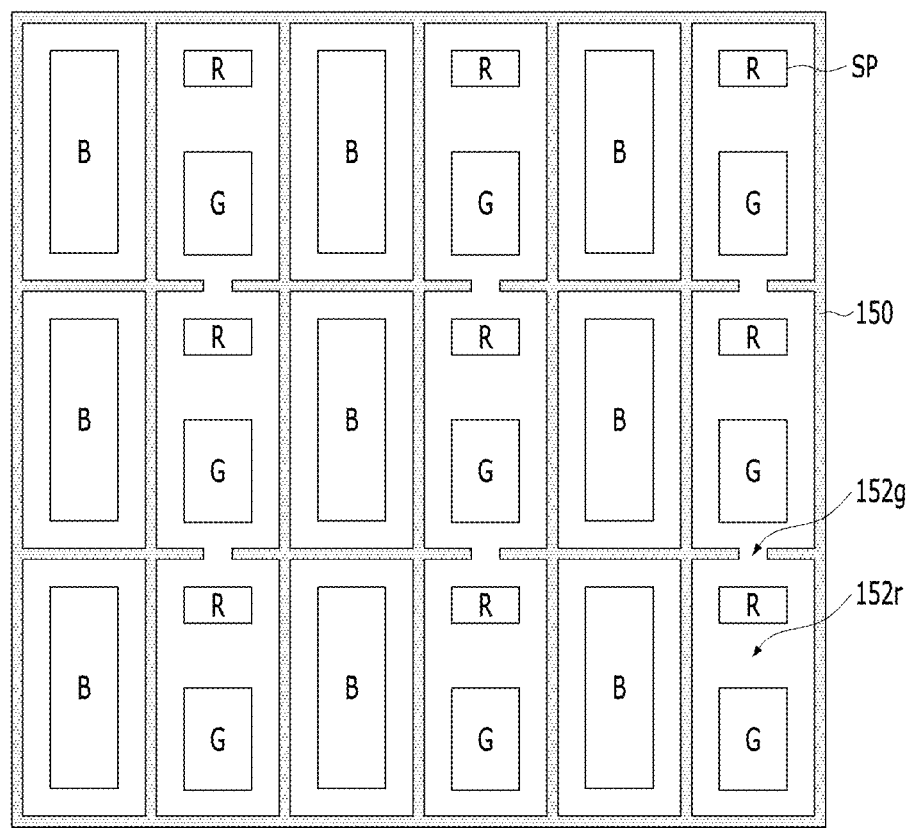

The touch electrode 150 shown in FIGS. 6A and 6B has therein red and green openings 152r and 152g. The green opening 152g is formed by removing a portion of the touch electrode 150 that is located at the lower end of the green (G) subpixel SP. The red opening 152r is formed to have a larger line width than the green opening 152g. Specifically, as shown in FIG. 6A, the red opening 152r is formed by removing a portion of the touch electrode 150 that is located at the lower end of the red (R) subpixel SP. Alternatively, as shown in FIG. 6B, the red opening 152r is formed by removing the entirety of the touch electrode 150 that is located at the lower end of the red (R) subpixel SP.

Figure 6C:
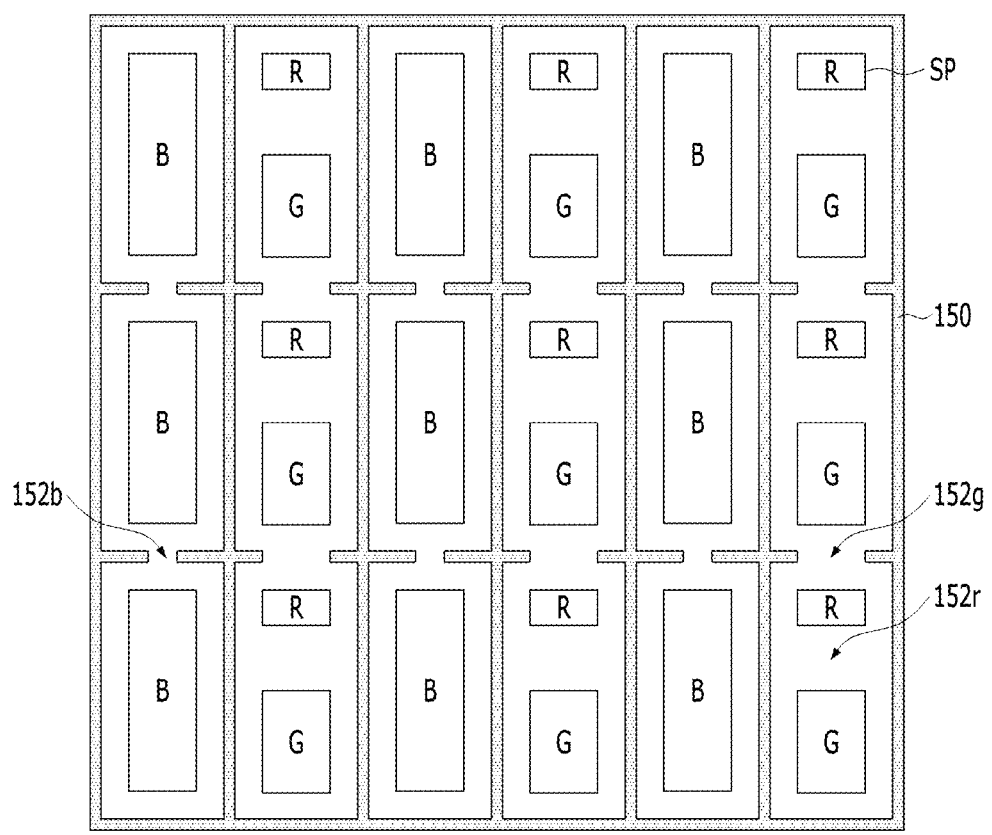

The touch electrode 150 shown in FIG. 6C has therein red, green and blue openings 152r, 152g and 152b. The blue opening 152b is formed by removing a portion of the touch electrode 150 that is located at the lower end of the blue (B) subpixel SP. The green opening 152g is formed by removing a portion of the touch electrode 150 that is located at the lower end of the green (G) subpixel SP so as to have a larger line width than the blue opening 152b. The red opening 152r is formed by removing a portion or the entirety of the touch electrode 150 that is located at the lower end of the red (R) subpixel SP so as to have a larger line width than the green opening 152g.

Figure 6D:
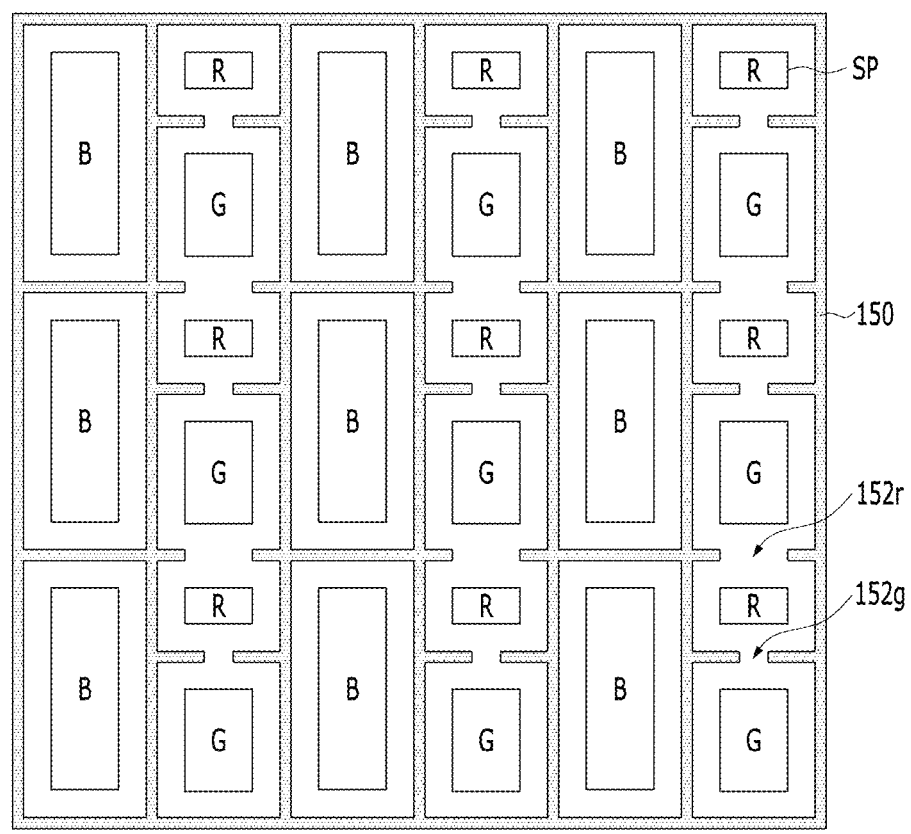

The touch electrode 150 shown in FIG. 6D has therein red and green openings 152r and 152g. The green opening 152g is formed by removing a portion of the touch electrode 150 that is located at the upper end of the green (G) subpixel SP. The red opening 152r is formed by removing a portion or the entirety of the touch electrode 150 that is located at the upper end of the red (R) subpixel SP so as to have a larger line width than the green opening 152g.

Typically, the gaze of a user using the touch display device is directed from the lower end of the touch display device toward the upper end thereof. Thus, as shown in FIGS. 6A to 6C, it is preferable to form the opening 152r, 152g or 152b in each subpixel SP by removing the touch electrode 150 that is located at the lower end of each subpixel SP. However, as shown in FIG. 6D, it may be possible to form the opening 152r, 152g and 152b in each subpixel SP by removing the touch electrode 150 that is disposed at the upper end of each subpixel SP.

Figure 7:
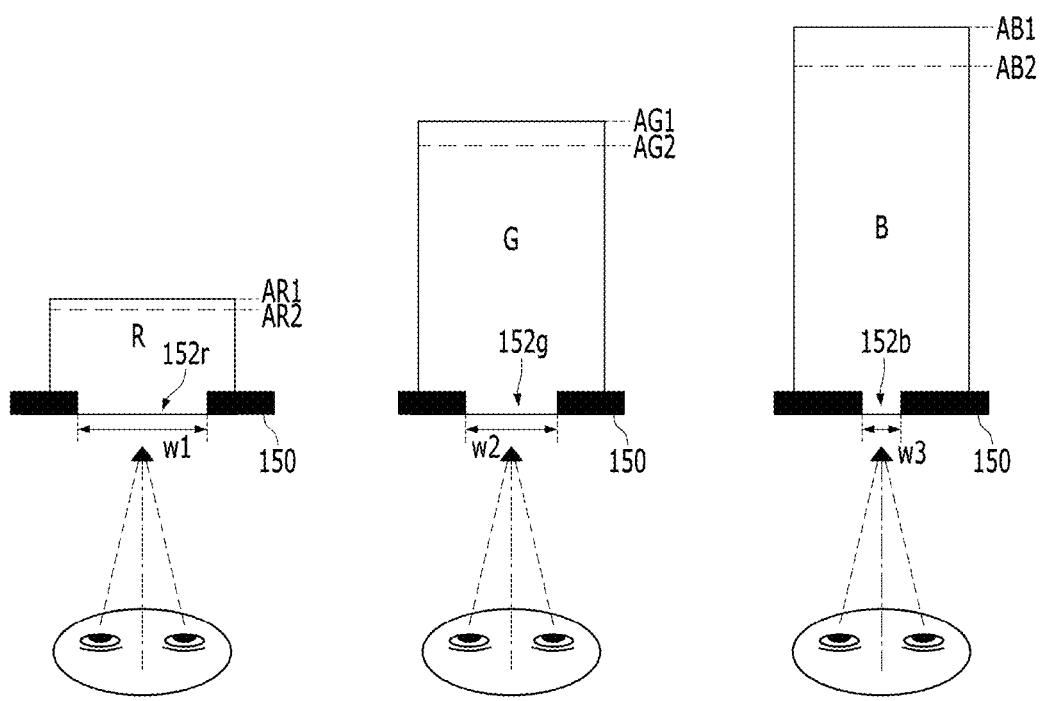
FIG. 7 is a view showing emission areas at a front viewing angle and at a side viewing angle in the touch display device according to the present invention.

When a user uses the touch display device having the touch electrode 150 from a front viewing angle direction, as shown in FIG. 7, none of the light from the emission areas AR1, AG1 and AB1 of the red (R), green (G) and blue (B) subpixels SP is blocked by the touch electrodes 150. Here, the front viewing angle direction refers to the situation in which the angle between the touch electrode 150 and the gaze of the user is 90 degrees.

When a user uses the touch display device from a side viewing angle direction, the ratios of the light-blocked areas to the emission areas in the red (R), green (G) and blue (B) subpixels SP are constant. Here, the side viewing angle direction refers to the situation in which the angle between the touch electrode 150 and the gaze of the user is equal to or greater than 45 degrees and less than 90 degrees.

Accordingly, the proportions of the emission areas AR1, AG1 and AB1 in the subpixels when viewed from the front viewing angle direction are the same as the proportions of the emission areas AR2, AG2 and AB2 in the subpixels when viewed from the side viewing angle direction. Thus, since the color coordinate characteristics at the front viewing angle and the color coordinate characteristics at the side viewing angle are similar to each other, it is possible to minimize variation in the color coordinate characteristics at the side viewing angle.

Table 1 shows the proportions of the emission areas in the subpixels depending on whether light is interrupted according to Comparative Examples 1 and 2 and the embodiment.

TABLE 1

|  | Red Subpixel | Green Subpixel | Blue Subpixel |
|---|---|---|---|
| Comparative Example 1 | 72% | 93% | 94% |
| Comparative Example 2 | 77% | 93% | 94% |
| Embodiment | 94% | 94% | 94% |

In Table 1, Comparative Example 1 represents a touch display device not including the red, green and blue openings 152r, 152g and 152b, Comparative Example 2 represents a touch display device including only the red opening 152r, and the embodiment represents a touch display device including the red opening 152r, which is formed by completely removing the touch electrode 150 that is disposed at the lower end of the red (R) subpixel SP, and the green opening 152g, which has a smaller line width than the red opening 152r, but not including the blue opening 152b, as shown in FIG. 6A. As can be seen in Table 1, in Comparative Examples 1 and 2, the proportion of the emission area in the red (R) subpixel SP depending on whether light is interrupted by the touch electrode 150 is lower than the proportions of the emission areas in the green (G) and blue (B) subpixels SP, whereby the color coordinates vary. On the other hand, according to the embodiment, the proportions of the emission areas in the red (R), green (G) and blue (B) subpixels SP are constant, whereby variation in the color coordinates may be prevented.

In addition, according to the present invention, the touch electrodes 150 have therein the openings 152r, 152g and 152b, thereby reducing the capacitance of the parasitic capacitor between the touch electrodes 150 and the cathode 126 of the light-emitting element 120.

Figure 8A:
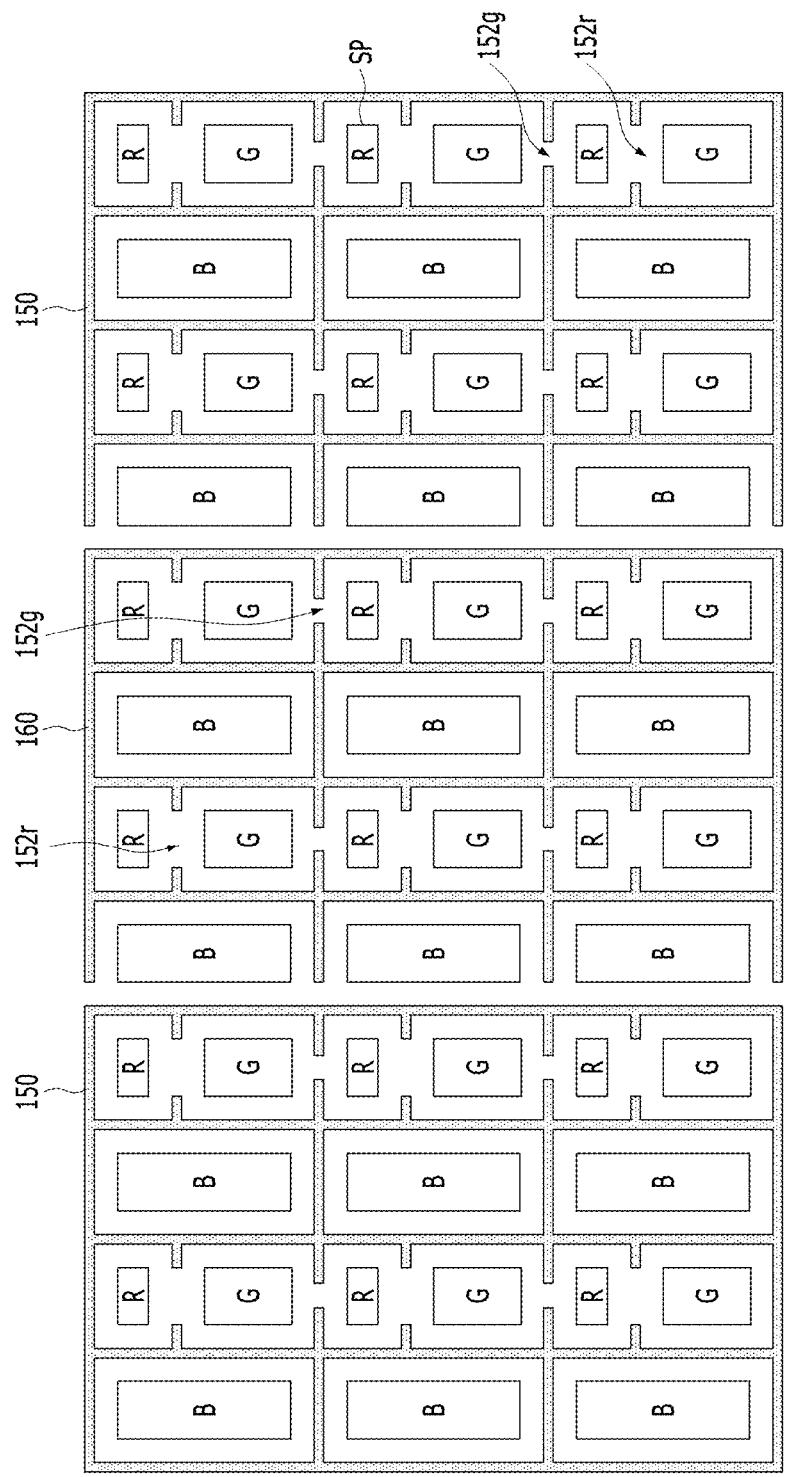
FIG. 8A is a plan view showing the first region A1 shown in FIG. 2 in detail.
Figure 8B:
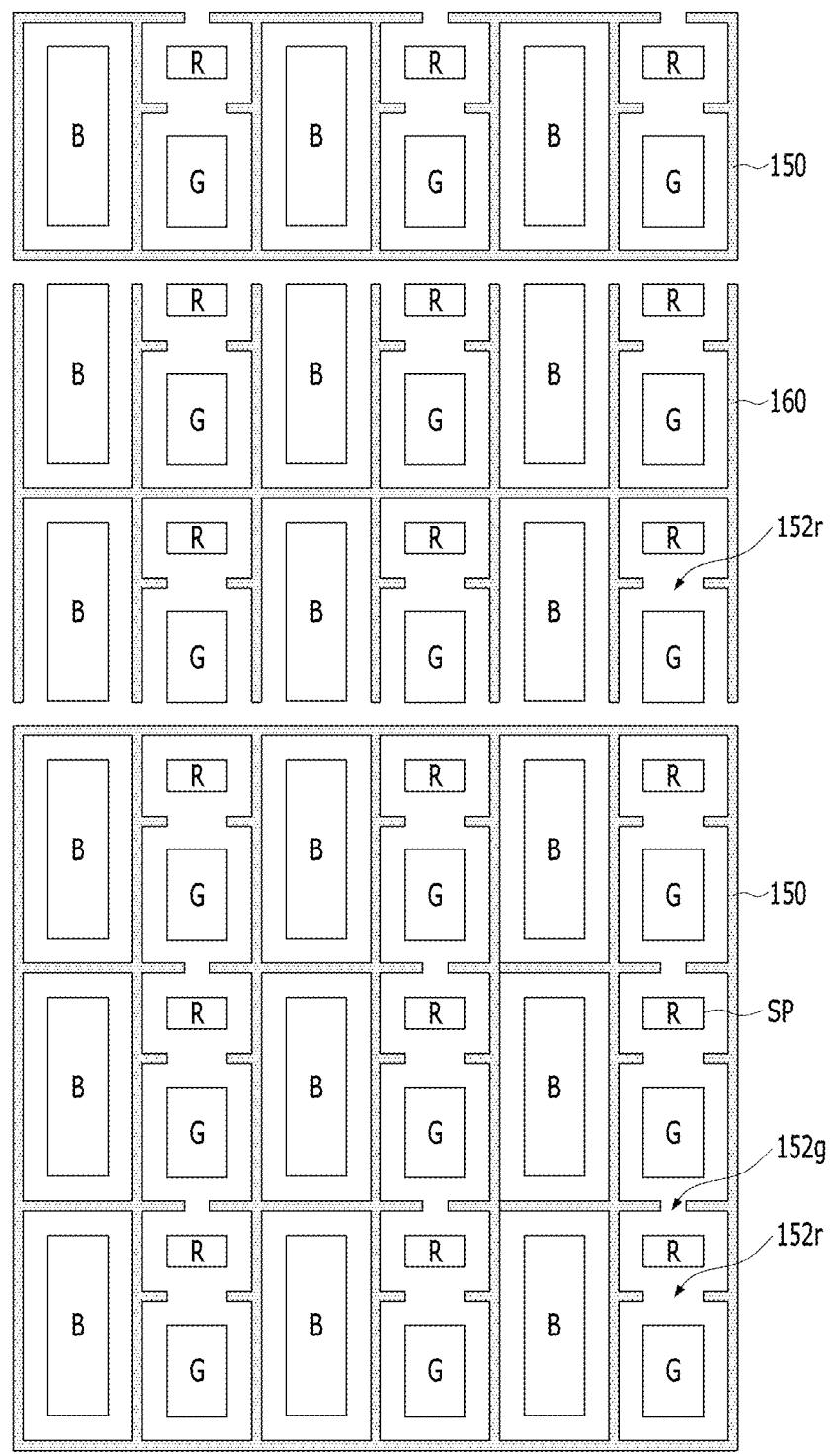
FIG. 8B is a plan view showing the second region A2 shown in FIG. 2 in detail.

The present invention has been described by way of example as having a structure in which the openings 152r, 152g and 152b are formed in the touch electrodes 150. However, the openings 152r, 152g and 152b may also be formed in the touch lines 160 in the vertical direction disposed between the touch electrodes 150 shown in FIG. 8A and the touch lines 160 in the horizontal direction disposed between the touch electrodes 150 shown in FIG. 8B. The openings 152r, 152g and 152b are disposed in the touch lines 160 located at the lower ends of the subpixels SP surrounded by the touch lines 160. Accordingly, the proportions of the emission areas in the red (R), green (G) and blue (B) subpixels SP corresponding to the touch lines 160 depending on whether light is interrupted by the touch lines 160 are constant, thereby preventing variation in the color coordinates.

Figure 9:
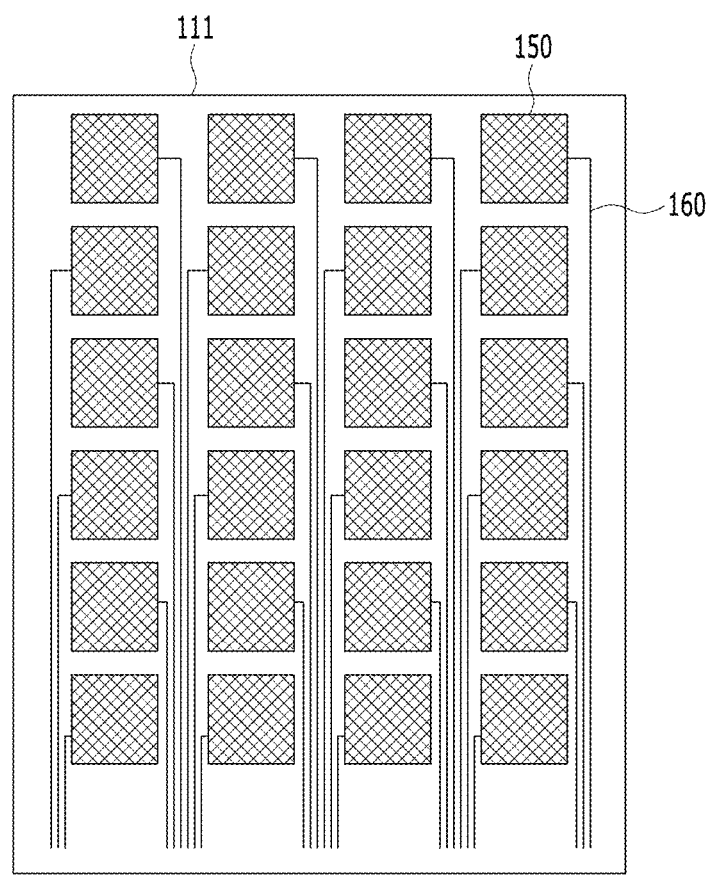
FIG. 9 is a plan view showing another embodiment of the routing lines shown in FIG. 2.

The touch lines 160 according to the present invention have been described by way of example as extending to the touch pad 170 through the bezel area, as shown in FIG. 3. However, as shown in FIG. 9, the touch lines 160 may extend to the touch pad 170 through the non-emission area between the touch electrodes 150.

The present invention has been described by way of example as having a structure in which the green subpixel has a larger emission area than the red subpixel and has a smaller emission area than the blue subpixel. However, the present invention is not limited thereto. For example, the red subpixel may have a larger emission area than the green (blue) subpixel and may have a smaller emission area than the blue (green) subpixel. Alternatively, the blue subpixel may have a larger emission area than the green (red) subpixel and may have a smaller emission area than the red (green) subpixel.

In addition, although a self-capacitance-type touch sensor structure has been described by way of example, the present invention can also be applied to a mutual-capacitance-type touch sensor structure.

As is apparent from the above description, in a touch display device according to the present invention, touch electrodes surrounding respective subpixels have therein openings, and the openings are formed to be inversely proportional to the sizes of the emission areas of the respective subpixels. Accordingly, the proportions of the emission areas in the subpixels depending on whether light is interrupted by the touch electrodes are similar to (the same as) each other, thereby minimizing viewing-angle-dependent variation in color coordinates.

In addition, owing to the openings formed in the touch electrodes, it is possible to reduce the capacitance of a parasitic capacitor between the touch electrodes and a cathode.

It will be apparent to those skilled in the art that various modifications and variations can be made in the touch display device of the present disclosure without departing from the technical idea or scope of the disclosure. Thus, it is intended that the present disclosure covers the modifications and variations of this disclosure provided they come within the scope of the appended claims and their equivalents.

What is claimed is:

1. A touch display device, comprising:
   a substrate;
   a light-emitting element disposed in each of a plurality of subpixels comprising emission areas having different sizes and disposed on the substrate, the plurality of subpixels including a plurality of first subpixels of a first color and a plurality of second subpixels of a second color;
   an encapsulation unit disposed on the light-emitting element; and
   a plurality of touch electrodes disposed on the encapsulation unit and collectively having a mesh shape to surround the plurality of subpixels, respectively,
   wherein the plurality of touch electrodes includes:
      a plurality of first touch electrodes each disposed at a perimeter along sides of a corresponding one of the plurality of first subpixels of the first color in a plan view to surround the corresponding one of the plurality of first subpixels of the first color; and
      a plurality of second touch electrodes each disposed at a perimeter along sides of a corresponding one of the plurality of second subpixels of the second color in the plan view to surround the corresponding one of the plurality of second subpixels of the second color,
   wherein a first touch electrode among the plurality of first touch electrodes has a first opening at one side of a corresponding first subpixel among the plurality of first subpixels, and a second touch electrode among the plurality of second touch electrodes has a second opening at one side of a corresponding second subpixel among the plurality of second subpixels in the plan view, and
   wherein the corresponding second subpixel has a larger emission area than the corresponding first subpixel, and the second opening has a smaller width than the first opening in the plan view.

2. The touch display device according to claim 1, wherein widths of the first opening and the second opening are inversely proportional to sizes of respective emission areas of the corresponding first subpixel and the corresponding second subpixel.

3. The touch display device according to claim 1, wherein the plurality of subpixels further comprises a plurality of third subpixels of a third color, and
   wherein the corresponding second subpixel has a smaller emission area than one of the third subpixels.

4. The touch display device according to claim 3, wherein the plurality of touch electrodes further includes a plurality of third touch electrodes each surrounding a corresponding one of the third subpixels, a third touch electrode among the third touch electrodes having a third opening, and
   wherein the third opening has a smaller width than the second opening.

5. The touch display device according to claim 3, wherein the first color is red,
   wherein the second color is green, and
   wherein the third color is blue.

6. The touch display device according to claim 1, wherein the first opening is formed by removing a portion of the first touch electrode disposed at a lower end of the corresponding first subpixel, and
   wherein the second opening is formed by removing a portion of the second touch electrode disposed at a lower end of the corresponding second subpixel.

7. The touch display device according to claim 1, further comprising:
   a plurality of touch lines connected to the plurality of first touch electrodes,
   wherein an opening is formed in one of the touch lines located at a lower end of a corresponding one of the plurality of subpixels surrounded by the touch lines.

8. The touch display device according to claim 1, wherein the encapsulation unit comprises a plurality of inorganic encapsulation layers and at least one organic encapsulation layer.

9. The touch display device according to claim 8, wherein a first side surface of at least one of the plurality of inorganic encapsulation layers protrudes more than a second side surface of the at least one organic encapsulation layer.

10. The touch display device according to claim 8, further comprising:
    a touch pad electrically connected to the plurality of touch electrodes.

11. The touch display device according to claim 10, wherein at least one of the plurality of inorganic encapsulation layers extends more toward the touch pad than the at least one organic encapsulation layer.

12. The touch display device according to claim 10, further comprising a touch buffer film disposed between the encapsulation unit and the plurality of touch electrodes.

13. The touch display device according to claim 12, wherein the touch pad comprises:
    a lower touch pad electrode on the substrate; and
    an upper touch pad electrode connected to the lower touch pad electrode and disposed on the touch buffer film.

14. The touch display device according to claim 1, further comprising:
    a bank disposed under the encapsulation unit between the emission areas of the plurality of subpixels,
    wherein the plurality of touch electrodes overlap with the bank without overlapping with the emission areas in the plan view, and
    wherein the first opening does not overlap with the emission area of the corresponding first subpixel in the plan view.

15. The touch display device of claim 1, wherein the first opening is an area in which a portion of the first touch electrode along the one side of the corresponding first subpixel is cut between the corresponding first subpixel of the first color and an adjacent subpixel of a color different from the first color among the plurality of subpixels.

16. The touch display device of claim 1, wherein the first touch electrode surrounds the corresponding first subpixel without surrounding another of the plurality of subpixels.

17. A touch display device, comprising:
    a substrate;
    a light-emitting element disposed in each of a plurality of subpixels comprising emission areas having different sizes and disposed on the substrate, the plurality of subpixels including a plurality of first subpixels of a first color and a plurality of second subpixels of a second color having a larger emission area than the plurality of first subpixels;
an encapsulation unit disposed on the light-emitting element; and
a plurality of touch electrodes disposed on the encapsulation unit and collectively having a mesh shape to surround the plurality of subpixels, respectively,
wherein the plurality of touch electrodes includes:
   a plurality of first touch electrodes each disposed at a perimeter along sides of a corresponding one of the plurality of first subpixels in a plan view to surround the corresponding one of the plurality of first subpixels; and
   a plurality of second touch electrodes each disposed at a perimeter along sides of a corresponding one of the plurality of second subpixels in the plan view to surround the corresponding one of the plurality of second subpixels, and
wherein each of the plurality of first touch electrodes has a first opening at one side of the corresponding one of the plurality of first subpixels in the plan view, and each of the plurality of second touch electrodes has a second opening at one side of the corresponding one of the plurality of second subpixels in the plan view and having a smaller width than the first opening.

18. The touch display device according to claim 17, wherein the plurality of subpixels further comprises a plurality of third subpixels of a third color, and
wherein one of the second subpixels has a smaller emission area than one of the third subpixels.

19. The touch display device according to claim 17, further comprising:
   a plurality of touch lines connected to the plurality of first and second touch electrodes,
   wherein an opening is formed in one of the touch lines located at a lower end of a corresponding one of the plurality of first and second subpixels surrounded by the touch lines.

20. The touch display device according to claim 17, further comprising:
   a bank disposed under the encapsulation unit between the emission areas of the plurality of subpixels,
   wherein the plurality of touch electrodes overlap with the bank without overlapping with the emission areas in the plan view, and
   wherein the first opening does not overlap with an emission area of the corresponding one of the plurality of first subpixels in the plan view, and the second opening does not overlap with an emission area of the corresponding one of the plurality of second subpixels in the plan view.

21. The touch display device according to claim 17, further comprising a touch buffer film disposed between the encapsulation unit and the plurality of touch electrodes.

22. The touch display device of claim 17, wherein each of the plurality of first touch electrodes surrounds the corresponding one of the plurality of first subpixels without surrounding another of the plurality of subpixels, and each of the plurality of second touch electrodes surrounds the corresponding one of the plurality of second subpixels without surrounding another of the plurality of subpixels.

* * * * *